(12) United States Patent
Letor et al.

(10) Patent No.: US 11,894,657 B2
(45) Date of Patent: Feb. 6, 2024

(54) PULSE GENERATOR CIRCUIT, RELATED SYSTEM AND METHOD

(71) Applicants: STMicroelectronics (Rousset) SAS, Rousset (FR); STMicroelectronics S.r.l., Agrate Brianza (IT)

(72) Inventors: Romeo Letor, Mascalucia (IT); Vanni Poletto, Milan (IT); Antoine Pavlin, Puyricard (FR); Nadia Lecci, Tremestieri Etneo (IT); Alfio Russo, Acireale (IT)

(73) Assignees: STMicroelectronics S.r.l., Agrate Brianza (IT); STMicroelectronics (Rousset) SAS, Rousset (FR)

( * ) Notice: Subject to any disclaimer, the term of this patent is extended or adjusted under 35 U.S.C. 154(b) by 380 days.

(21) Appl. No.: 17/360,381

(22) Filed: Jun. 28, 2021

(65) Prior Publication Data
US 2022/0013984 A1    Jan. 13, 2022

(30) Foreign Application Priority Data
Jul. 7, 2020 (IT) .................. 102020000016396

(51) Int. Cl.
*H01S 5/062* (2006.01)
*H03K 5/07* (2006.01)
*H01S 5/026* (2006.01)

(52) U.S. Cl.
CPC ........ *H01S 5/06216* (2013.01); *H01S 5/0261* (2013.01); *H03K 5/07* (2013.01)

(58) Field of Classification Search
CPC ..................................................... H01S 5/062
See application file for complete search history.

(56) References Cited

U.S. PATENT DOCUMENTS

| 5,736,881 A | 4/1998 | Ortiz |
| 9,368,936 B1 * | 6/2016 | Lenius .................... G01S 17/10 |

(Continued)

FOREIGN PATENT DOCUMENTS

| EP | 3629462 A1 | 4/2020 |
| JP | 2009260030 A | 11/2009 |
| WO | 2018041867 A1 | 3/2018 |

OTHER PUBLICATIONS

OSRAM, "LiDar Teach-In," OSRAM Licht AG, Jun. 20, 2018, 22 pages, Munich, DE.

*Primary Examiner* — Tuan N Nguyen
(74) *Attorney, Agent, or Firm* — Slater Matsil, LLP

(57) ABSTRACT

An embodiment pulse generator circuit comprises a first electronic switch coupled between first and second nodes, and a second electronic switch coupled between the second node and a reference node. An LC resonant circuit comprising an inductance and a capacitance is coupled between the first and reference nodes along with charge circuitry comprises a further inductance in a current flow line between a supply node and an intermediate node in the LC resonant circuit. Drive circuitry of the electronic switches repeats, during a sequence of switching cycles, charge time intervals, wherein the capacitance in the LC resonant circuit is charged via the charge circuit, and pulse generation time intervals, wherein a pulsed current is provided to the load via the first and second nodes. The charge and pulse generation time intervals are interleaved with oscillation time intervals where the LC resonant circuit oscillates at a resonance frequency.

19 Claims, 7 Drawing Sheets

(56) References Cited

U.S. PATENT DOCUMENTS

| | | |
|---|---|---|
| 2003/0016711 A1 | 1/2003 | Crawford |
| 2015/0002115 A1* | 1/2015 | Shenoy et al. |
| 2018/0109074 A1* | 4/2018 | Gassend ............ H01S 5/06817 |
| 2018/0188360 A1 | 7/2018 | Berger et al. |
| 2018/0278017 A1 | 9/2018 | Mignoli et al. |
| 2019/0229493 A1 | 7/2019 | Stern |
| 2019/0386460 A1 | 12/2019 | Barnes et al. |
| 2020/0388987 A1 | 12/2020 | Moore |
| 2021/0218223 A1 | 7/2021 | Letor et al. |

* cited by examiner

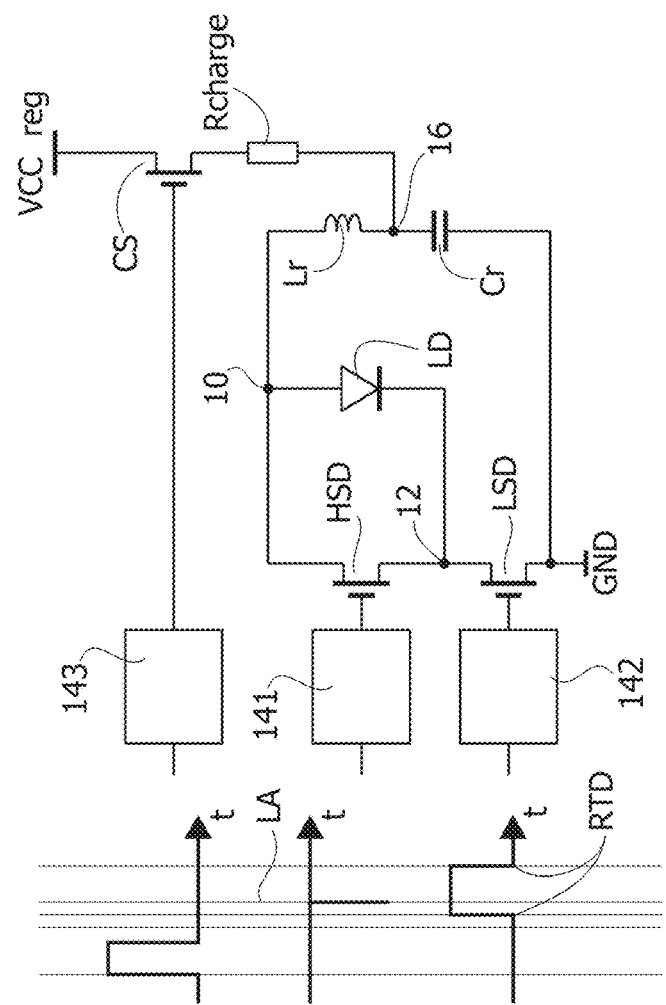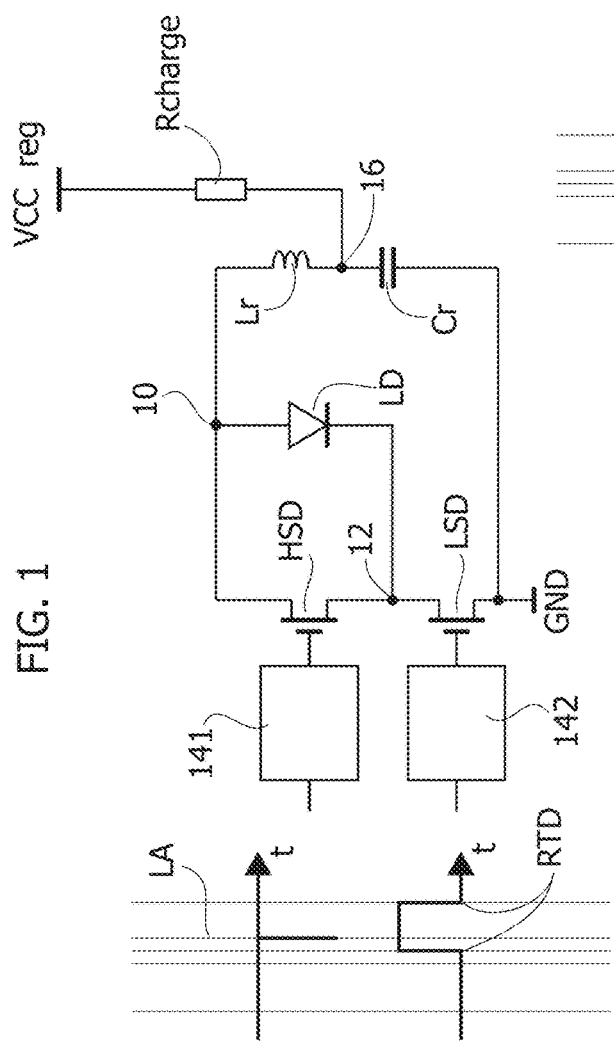

PULSE GENERATOR CIRCUIT, RELATED SYSTEM AND METHOD

CROSS-REFERENCE TO RELATED APPLICATIONS

This application claims the benefit of Italian Application No. 102020000016396, filed on Jul. 7, 2020, which application is hereby incorporated herein by reference.

TECHNICAL FIELD

The description relates to pulse generator circuits. One or more embodiments are applicable to pulse generator circuits for driving laser diodes.

BACKGROUND

Pulse generator circuits may be used in various applications such as power transistors and drivers, laser diode drivers, for instance in LIDAR (LIght Detection And Ranging or Laser Imaging Detection And Ranging) systems as increasingly used in the automotive sector.

In pulse generators as discussed in the foregoing, pulses may be generated using a resonant tank comprising a capacitor which is recharged during operation.

A short recharge time and a limited power dissipated in recharging the resonant tank capacitor are thus desirable features of such pulse generators.

SUMMARY

According to one or more embodiments, a pulse generator circuit has the features set forth in the claims that follow.

One or more embodiments may concern a related system. A LIDAR system for use in the automotive sector, for instance, comprising one or more laser diodes may be exemplary of such a system.

One or more embodiments may concern a related method.

The claims form an integral part of the technical teaching of the description provided herein.

In one or more embodiments, a resonant tank capacitor can be charged using a charging inductor, which may significantly reduce power dissipation in comparison with resistive charging.

One or more embodiments may exploit the resonance of a charging inductor, which may involve controlling the value of the capacitor voltage at a certain instant at a voltage which may be lower or higher than the supply voltage.

One or more embodiments facilitate accurate and non-dissipative charging of a resonant tank capacitor as used, for instance, to generate sub-nanosecond current pulses in a laser for LIDAR applications.

One or more embodiments may include a voltage regulation block with the function of charging the resonant tank capacitor in a fast and non-dissipative manner.

In one or more embodiments, the current flowing through the laser diode is linked to the charging voltage of the capacitor.

One or more embodiments may include a circuit topology (somewhat akin to a DC-DC converter) which can be synchronized with resonant tank activations. This is contrast with DC-DC converter topologies which involve a closed loop with feedback on the output current with the purpose of generating a constant current equal to the amplitude of the current flowing through an array of laser diodes (an array of vertical-cavity surface-emitting laser or VCSEL diodes, for instance).

One or more embodiments may provide one or more of the following advantages:
 low power dissipation, which facilitates miniaturization and efficiency,
 accurate charge control of the resonant tank,
 accurate control of laser current,
 integration facilitated.

BRIEF DESCRIPTION OF THE DRAWINGS

The features and advantages of embodiments will become apparent from the following detailed description of practical implementations thereof, shown by way of non-limiting example in the accompanying figures, wherein:

FIGS. 1 and 2 are circuit diagrams exemplary of resistive charging of a capacitor in a resonant tank in a pulse generator;

DETAILED DESCRIPTION OF ILLUSTRATIVE EMBODIMENTS

Figure 3:
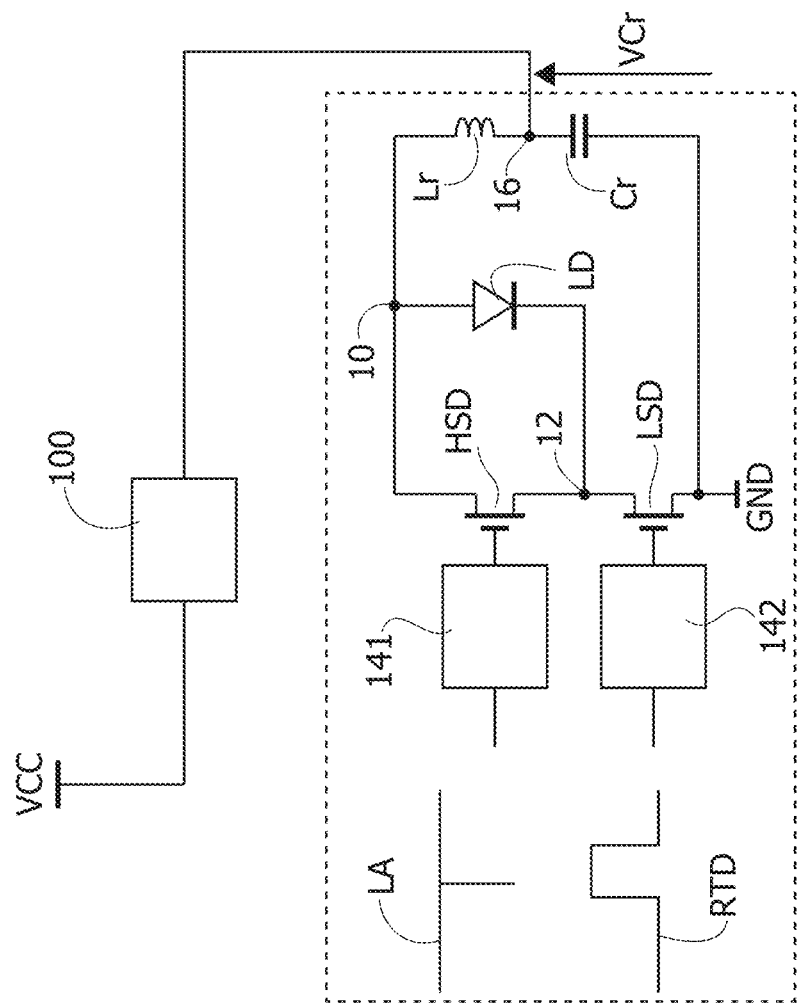
FIG. 3 is a general circuit diagram exemplary of non-dissipative charging of a capacitor in a resonant tank in a pulse generator.

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The headings/references used herein are only provided for convenience and hence do not define the sphere of protection or the scope of the embodiments.

Throughout the figures, like parts, elements or components are designated by like reference symbols and a detailed description will not be repeated for each and every figure in order not to burden the present detailed description.

Similarly, throughout this description a same designation may be used for simplicity to indicate a certain circuit node or line and a signal occurring at that node or line.

FIG. 1 shows an embodiment of a pulse generator circuit, such as a circuit as described in Italian patent application No. 102019000029132, and corresponding U.S. patent application Ser. No. 17/123,712.

FIG. 1 illustrates a pulse generator circuit used as a driver circuit for a laser diode LD.

As illustrated, the pulse generator circuit comprises a high-side electronic drive switch HSD and a low-side electronic drive switch LSD.

These switches may be transistors such as field-effect transistors, advantageously GaN (Gallium Nitride) transistors, as they can have switching times in the 100 ps range.

The laser diode LD is generally exemplary of an electrical load to which a pulse signal is intended to be applied. As such, the load as exemplified by the laser diode LD may be a distinct element from the pulse generator.

As illustrated:
the high-side electronic drive switch HSD is coupled between a first node 10 and a second node 12,
the low-side electronic drive switch LSD is coupled between the second node 12 and a reference node (for instance, ground GND), and
the electrical load is coupled between the first node s 10 and the second node 12.

In the exemplary case of the laser diode LD considered herein, the anode and the cathode of the laser diode LD are coupled to the first 10 and to the second node 12, respectively.

Two driver circuits 141, 142 are illustrated coupled to the control electrodes (gates, in the case of field-effect transistors) of the switches HSD and LSD.

An LC resonant tank including an inductor Lr and a capacitor Cr connected in series is provided coupled between the first node 10 and the reference node GND.

As illustrated, the inductor Lr is arranged intermediate the first node 10 and an intermediate node 16 of the resonant tank circuit and the capacitor Cr is arranged intermediate the node 16 and the reference node GND.

A charge resistor Rcharge is coupled between a regulated voltage node at a voltage VCC and the intermediate node 16 in the resonant circuit Lr, Cr.

The two driver circuits 141, 142 are configured to be operated in order to turn the drive switches 141, 142 alternately on (switch closed and conductive) and off (switch open and non-conductive) so that drive pulses are applied to the load (to produce pulsed laser operation of the laser diode LD, for instance) as schematically represented on the left-hand side of FIG. 1 where laser activation LA and resonant tank drive RTD are exemplified against a common time (abscissa) scale t.

For instance, Italian patent application No. 102019000029132/U.S. patent application Ser. No. 17/123, 712 (already cited) discloses a solution wherein the driver circuitry 141, 142 is configured to cyclically repeat during a sequence of switching cycles the following steps:

for a first time interval, close the first electronic switch HSD and open the second electronic switch LSD, wherein the first node 10 and the second node 12 are short circuited and the capacitance Cr in the LC resonant circuit Lr, Cr is charged via the charge circuit;

for a following second time interval, close the first electronic switch HSD and close the second electronic switch LSD, wherein the first node 10 and the second node 12 are short circuited and the LC resonant circuit Lr, Cr oscillates at a resonance frequency (identified by a time constant $Tr=2\pi*(Lr*Cr)^{1/2}$);

for a following third time interval, open the first electronic switch HSD and close the second electronic switch LSD, wherein the LC resonant circuit Lr, Cr provides a pulse current towards the load (here the laser diode LD) via the first node 10 and the second node 12; and for a following fourth time interval, close the first electronic switch HSD and the second electronic switch LSD, wherein the first node 10 and the second node 12 are short circuited and the LC resonant circuit Lr, Cr oscillates at the resonance frequency.

In a circuit as exemplified in FIG. 1, the current provided by the LC resonant circuit Lr, Cr oscillates with a given maximum current value and the drive circuitry 141, 142 can be controlled to start the third time interval when the current provided by the LC resonant circuit Lr, Cr reaches a threshold (maximum) current value.

In a circuit as exemplified in FIG. 1, the duration of the second time interval can be selected in a range between 90% and 110%, preferably between 95% and 105%, of one-fourth of the resonant period of the LC resonant circuit Lr, Cr.

In a circuit as exemplified in FIG. 1, the current provided by the LC resonant circuit Lr, Cr oscillates with a maximum current value and associated control circuitry may be configured to:
receive data identifying a requested current amplitude to be provided to two output terminals 10, 12; and
determine the duration of the second time interval as a function of the data identifying a requested current amplitude.

In a circuit as exemplified in FIG. 1, associated control circuitry may be configured to start the first time interval when the current provided by the LC resonant circuit Lr, Cr reaches zero.

It will be otherwise appreciated that embodiments herein are primarily concerned with the charge control of the resonant tank Lr, Cr in the pulse generator, rather than with details of operation as recalled previously, thus making it unnecessary to provide a more detailed description herein.

A solution as illustrated in FIG. 1 uses the resonant tank Lr, Cr to generate (very) fast current pulses to an electrical load such as a laser diode (for LIDAR applications, for instance).

The current amplitude of the laser pulse is fixed by the energy stored in the resonant tank. An accurate control of the laser current pulse amplitude thus involves controlling the amount of charge on the capacitor Cr at the time when the resonant tank is activated. This in turn involves recharging at a precise voltage value the capacitor of the resonant tank at the time of resonant tank activation.

A fast recharge thus plays a role in facilitating activating the laser LD at a high activation frequency.

A fast capacitor charge in turn militates against a precise voltage control. Also, high frequency charging can result in high power dissipation in the charging circuit.

As illustrated in FIG. 1, the capacitor is charged via a voltage reference source VCC and a resistor Rcharge.

The resistance value of Rcharge can be selected high enough to avoid interference with the resonant tank, with Vcc/Rcharge (much) smaller than the peak current Ipeak.

As a consequence, charging Cr may become a critical factor when activating the laser at high frequency is desired: a small resistance value of Rcharge, as beneficial for a fast (re)charge would in fact conflict with countering interference with the resonant tank as discussed previously.

This issue may be addressed as illustrated in FIG. 2, where parts, elements or components already discussed in connection with FIG. 1 are designated with the same reference symbols.

As illustrated in FIG. 2, the capacitor Cr is charged with a "commutated" resistor Rcharge, so that fast charging of Cr can be obtained with a small value of Rcharge without interfering with the resonant tank.

As illustrated in FIG. 2, a charging switch CS (this may again be a transistor such as a field-effect transistor) is arranged between VCC and Rcharge. The switch CS can be controlled (that is, made alternately conductive and non-conductive) by a respective driver circuit 143 coupled to the control electrodes (gate, in the case of a field-effect transistor) of the switch CS1.

The driver 143 can be actuated in a synchronized manner with the drivers 141 and 142 as schematically represented on the left-hand side of FIG. 2 where the timing of the Cr charge process CRC is exemplified against a common time (abscissa) scale t together with laser activation LA and resonant tank drive RTD.

The solution of FIG. 2 may be advantageous insofar as a low value of Rcharge facilitates fast charging of Cr (for instance 1/(Rcharge*Cr) may be less than 3*Laser pulse frequency.

Also, when the switch CS is off, Rcharge has no influence on the resonant circuit.

The solution illustrated in FIG. 2 may thus be adequate for laser pulse frequencies in the 100 kHz range.

One may otherwise note that, if the solution of FIG. 2 is resorted to for resistive charging of Cr, the energy dissipated in the switch CS and in Rcharge is essentially the same energy involved in charging the capacitor, which is equal to the energy lost during resonant tank activation. This results in energy losses equaling the energy dissipated in the switch CS and the energy losses in the resonant tank.

The power dissipation in the switch is equal to these energy losses times the resonant tank activation frequency (or the frequency of the laser pulses).

If a laser activation frequency is envisaged in the range of 500 kHz, the power dissipation in the switch CS can be as high as several watts, with the power dissipation of the laser driver system substantially doubled.

It is noted that high power dissipation may be undesirable for various reasons:
- adequate cooling may involve a large heat sink, with achieving a good thermal coupling of the laser driver with the heat sink representing a critical point,
- the laser driver may be difficult to miniaturize due to high power dissipation density,
- efficiency may be low inasmuch as the total power dissipation of the laser driver may be doubled (twice the energy losses of in the resonant tank),
- power dissipation may become prohibitively high for very high laser frequencies (e.g. 500 kHz).

One or more embodiments may address the issues discussed in the foregoing along the lines of a solution for non-dissipative charging of Cr as illustrated in general terms in FIG. 3.

In FIG. 3 (and in the following figures as well), parts, elements or components like parts, elements or components already discussed in connection with FIGS. 1 and 2 are designated with like reference symbols and a corresponding detailed description will not be repeated for brevity.

As noted, the embodiments herein are primarily concerned with the charge control of the resonant tank Lr, Cr in the pulse generator, rather than with other details of circuit operation (opening/closing the switches HSD and LSD): for the purposes herein such circuit operation can be held to correspond to the cyclical operation including subsequent first, second, third and fourth time intervals as recalled previously in connection with FIG. 1.

Briefly, a circuit as generally exemplified in FIG. 3 may comprise drive circuitry (141, 142—see also 14 in FIG. 8) of the first electronic switch HSD and the second electronic switch LSD configured to cyclically repeat during a sequence of switching cycles:
- charge time intervals (see the first time interval recalled previously in connection with FIG. 1), wherein the first electronic switch HSD is closed and the second electronic switch LSD is open and the capacitance Cr in the LC resonant circuit Lr, Cr is charged via the charge circuit 100,
- pulse generation time intervals (following the charge time intervals—see the third time interval recalled previously in connection with FIG. 1), wherein the first electronic switch HSD is open and the second electronic switch LSD is closed and the LC resonant circuit Lr, Cr provides a pulsed current to the load (here the laser diode LD) via the first node 10 and the second node 12,
- oscillation time intervals (see the second time interval and the fourth time interval recalled previously in connection with FIG. 1) interleaved with the charge and pulse generation time intervals; in the oscillation time intervals the first electronic switch HSD and the second electronic switch LSD are both closed and the LC resonant circuit Lr, Cr oscillates at a resonance frequency.

In the solution generally illustrated in FIG. 3, the capacitor Cr in the resonant tank is charged using a switching circuit 100 which can be essentially assimilated to a DC-DC converter coupled between the node VCC and the node 16 with the purpose of re-charging the capacitor Cr with minimal power dissipation.

Reference to a DC-DC converter indicates that any DC-DC converter topology known to those of skill in the art (buck, boost, buck boost, resonant, just to mention a few by way of example) can be taken as a model for the circuit 100, being otherwise understood that the circuit 100 embodies a specific topology which can be synchronized with resonant tank activations.

In that respect it is noted that, while certainly advantageous, synchronized operation (that is, synchronizing the PWM signal with the resonant tank activation frequency) is not mandatory; also, the switching frequency can be different from the resonant tank frequency activations. In fact it is possible to generate a charge current for Cr with a frequency different (e.g. higher) than the frequency of resonant tank activations as this would not involve a synchronization with the resonant tank.

For the purposes herein, one may essentially note that the drive circuitry (141, 142—see also 14 in FIG. 8) in the circuit of FIG. 3 is configured to act on the first electronic switch HSD and the second electronic switch LSD in order to repeat switching cycles comprising charge time intervals (see the first time interval recalled previously in connection with FIG. 1), wherein the first electronic switch HSD is closed and the second electronic switch LSD is open and the capacitance Cr in the LC resonant circuit Lr, Cr is charged with an inductor (L Charge) capable of resonating with the capacitor.

An approach as considered herein lends itself to being implemented according to different options. These different options can be synchronized with the resonant tank activations in order to facilitate reaching a desired value for the charge voltage V Cr on the capacitor Cr in coordination with the resonant tank (notionally, in the very instant the resonant tank is activated).

Figure 6B:
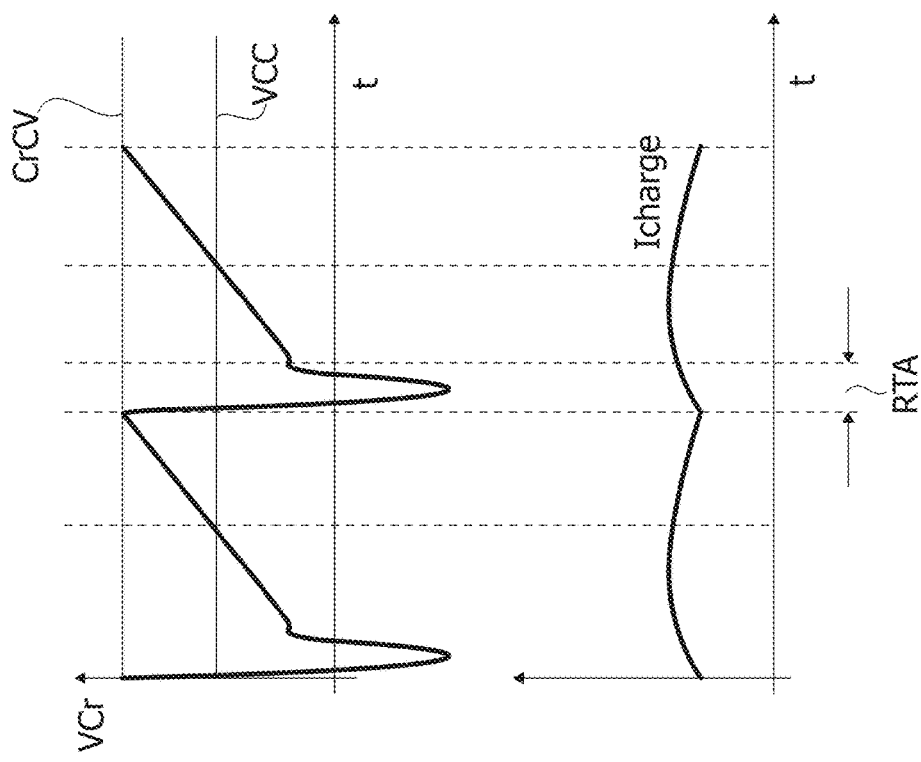
FIG. 6B is a diagram illustrative of a possible time behavior of signals which may occur in the implementation of FIG. 6A.
Figure 6A:
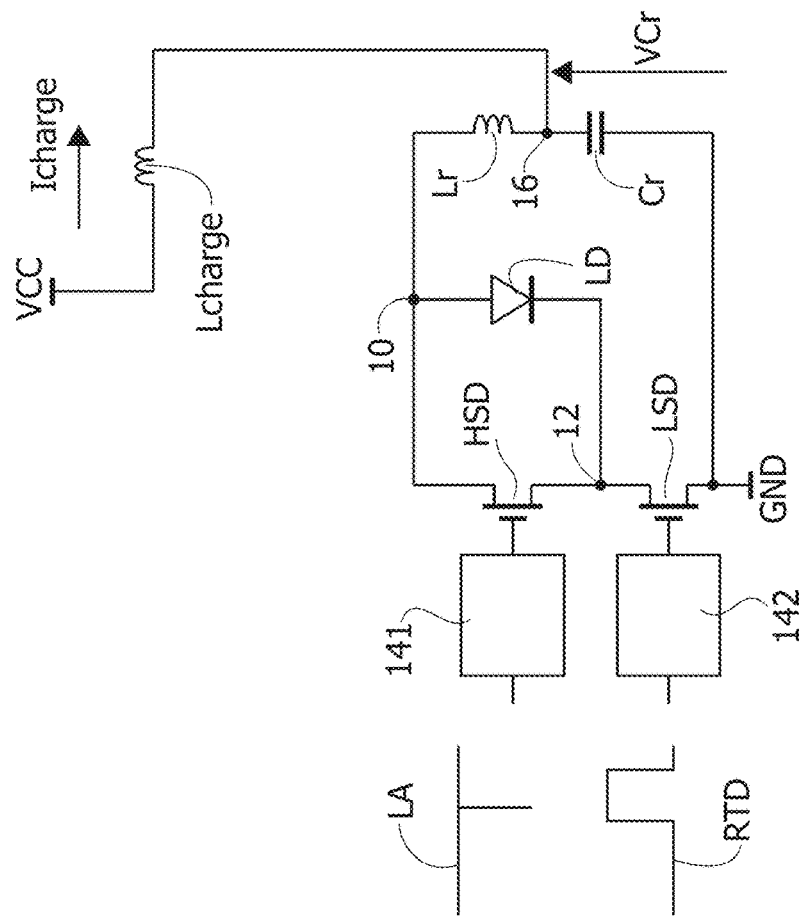
FIG. 6A is a circuit diagram exemplary of continuous current implementation of non-dissipative charging of a capacitor.
Figure 7B:
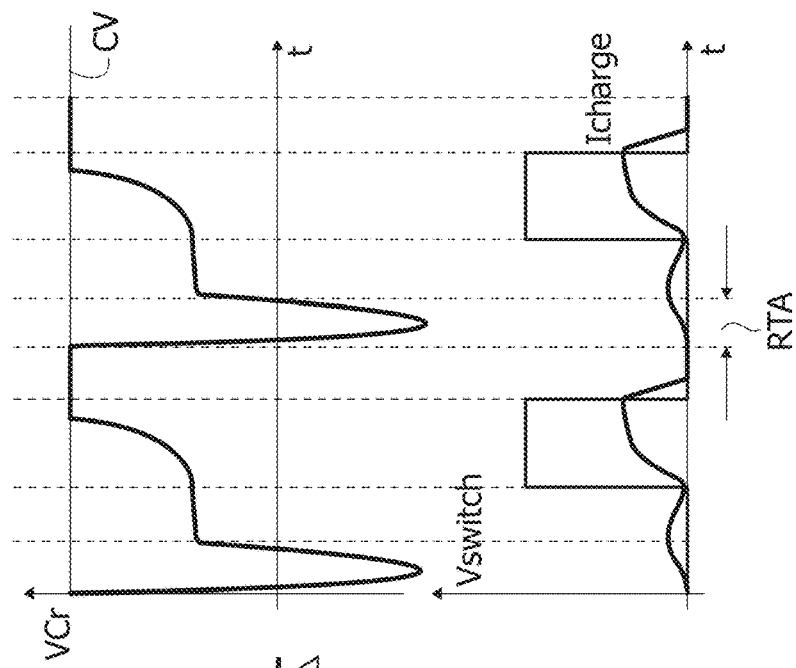
FIG. 7B is a diagram illustrative of a possible time behavior of signals which may occur in the implementation of FIG. 7A.
Figure 7A:
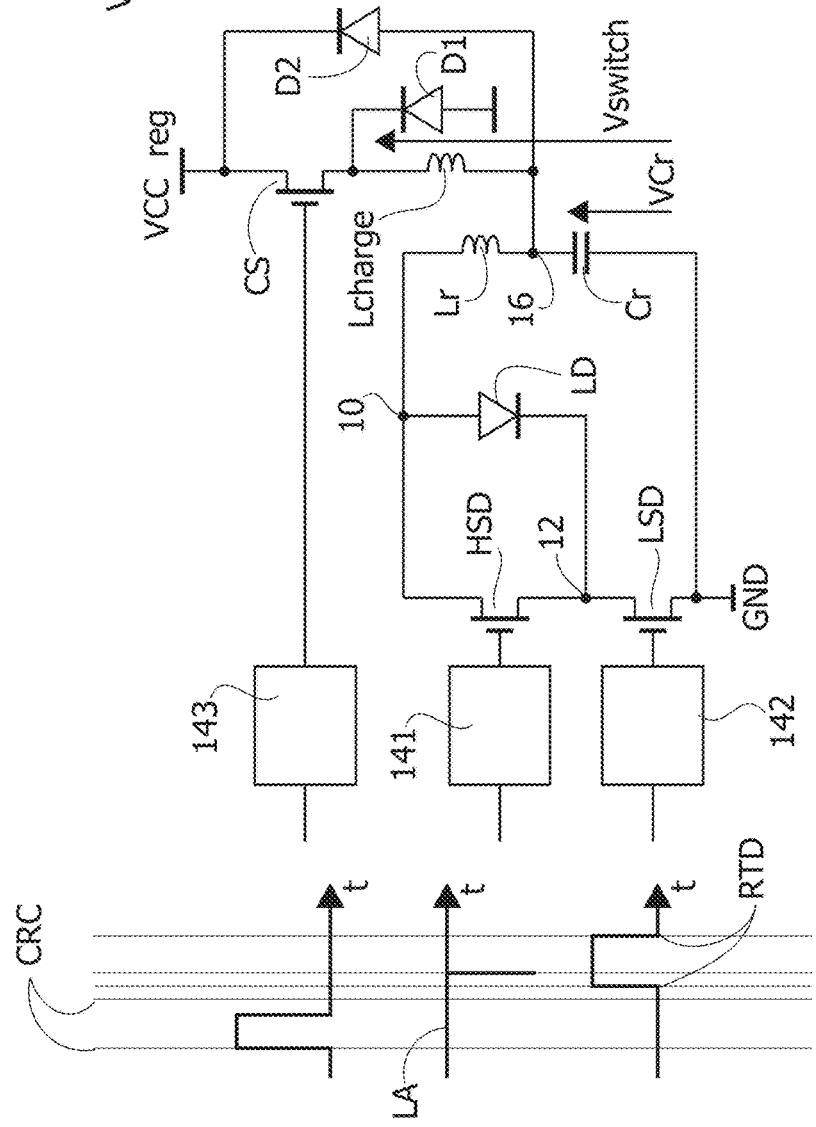
FIG. 7A is a circuit diagram exemplary of clamped and discontinuous inductor current implementation of non-dissipative charging of a capacitor.

In the following, various such options will be discussed:
non-dissipative charge control of Cr in an open loop (FIGS. 4 and 4A);
non-dissipative charge control of Cr in a closed loop (FIGS. 5 and 5A);
non-dissipative charge control of Cr With continuous current (FIGS. 6 and 6A);
non-dissipative charge control of Cr with clamp and discontinuous inductor current (FIGS. 7 and 7A).

Turning first to the non-dissipative charge control of Cr in an open loop, FIG. 4 illustrated a charge switch circuit 102 comprising and a H (half)bridge including a first electronic switch 102a and a second electronic switch 102b (as noted these may be transistors such as field-effect transistors, like GaN transistors, for instance).

The switches 102a, 102b are driven on and off alternately (see the inverter 102c coupled to the control electrode—gate, in the case of a field-effect transistor—of the switch 102b) to drive with a square voltage Vswitch an inductor (L Charge) coupled between the intermediate point 106 of the bridge and the capacitor Cr.

As illustrated, a (PWM modulated) square wave voltage to drive the switch circuit 102 can be produced by a comparator 104 by comparing the charging voltage of Cr (namely V Cr) with a threshold voltage (a fixed threshold 108 in the case illustrated in FIG. 4), generated in a manner known per se, so that the PWM signal is synchronized with the resonant tank activations.

The value of L Charge can be selected so that the average current Icharge through the inductor L Charge is higher than zero 0 with a ripple less than the average value so as to obtain a current control in a continuous mode.

In that way the capacitor Cr is charged with the current Icharge, with the value of Icharge (and hence the charge speed of Cr) being a function of the threshold voltage 108. Since the resonant tank activation frequency is constant, the value of V Cr at the instant when resonant tank is activated (that is the Cr charging voltage) will be a function of the (fixed) voltage threshold 108.

Figure 4A:
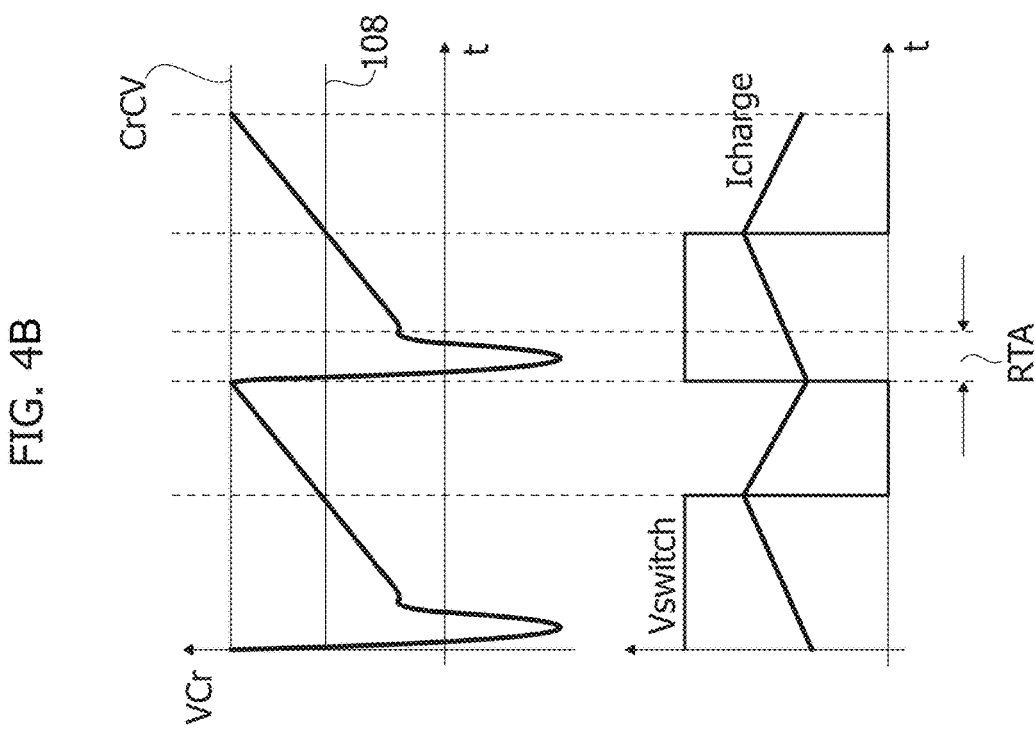
FIG. 4A is a circuit diagram exemplary of open loop implementation of non-dissipative charging of a capacitor.
Figure 4B:
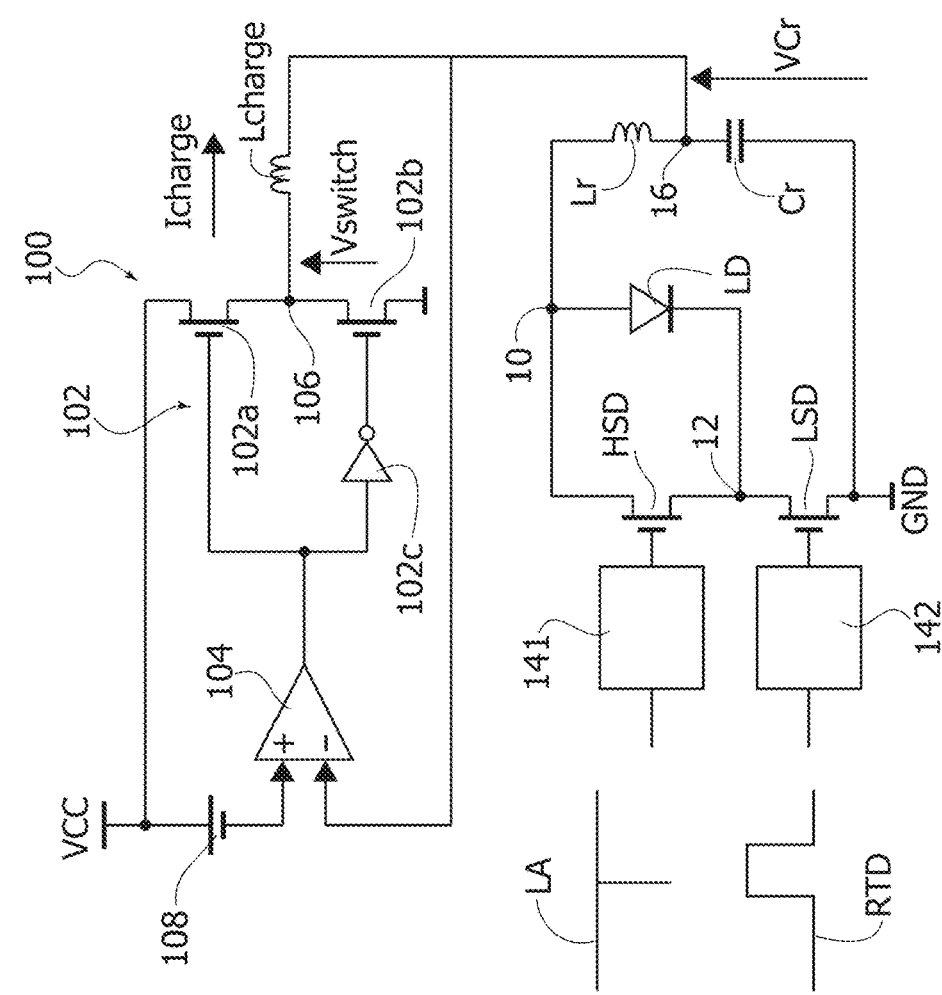
FIG. 4B is a diagram illustrative of a possible time behavior of signals which may occur in the implementation of FIG. 4A.

The diagrams of FIG. 4B illustrate, against a common abscissa time scale, possible time behaviors of:
the voltage V Cr across Cr, plotted against the threshold 108 and a desired charge voltage Cr CV (upper diagram), and
the charge current Icharge plotted against the on-off cycle of Vswitch (lower diagram, with resonant tank activation evidenced at RTA).

One may note that after few cycles from start up the charge switch 102 is synchronous with resonant tank activations and the value of V Cr at the times of tank activations remains substantially stable.

In an arrangement as illustrated in FIG. 4, the switch off threshold and component values can be designed in order to have the resonator voltage equal to VCC at the activation of the firing.

In an arrangement as illustrated in FIG. 4A, the recharge inductor L Charge operates in a continuous conduction mode.

For instance, the peak current in the recharge inductor may be 1.6 A with an average value of 1.3 A, which is adequate for recharging the resonator Lr, Cr in applications as discussed in the foregoing.

These are of course merely exemplary values, which are mentioned without any limiting intents of the embodiments.

Figure 5B:
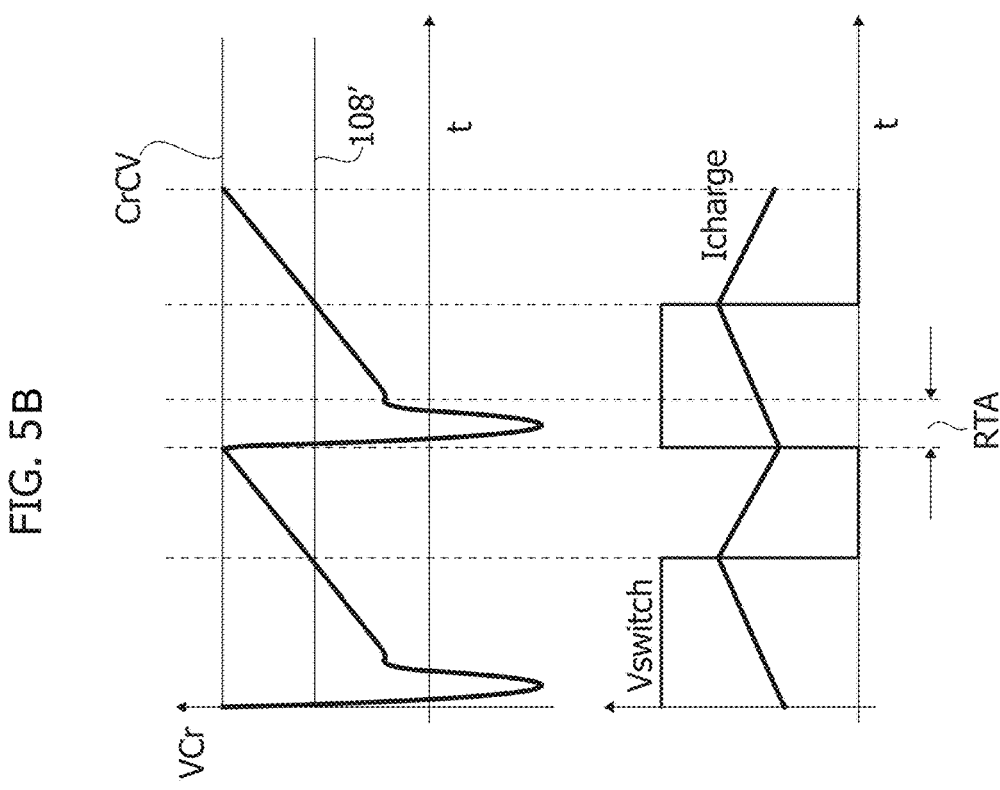
FIG. 5B is a diagram illustrative of a possible time behavior of signals which may occur in the implementation of FIG. 5A.
Figure 5A:
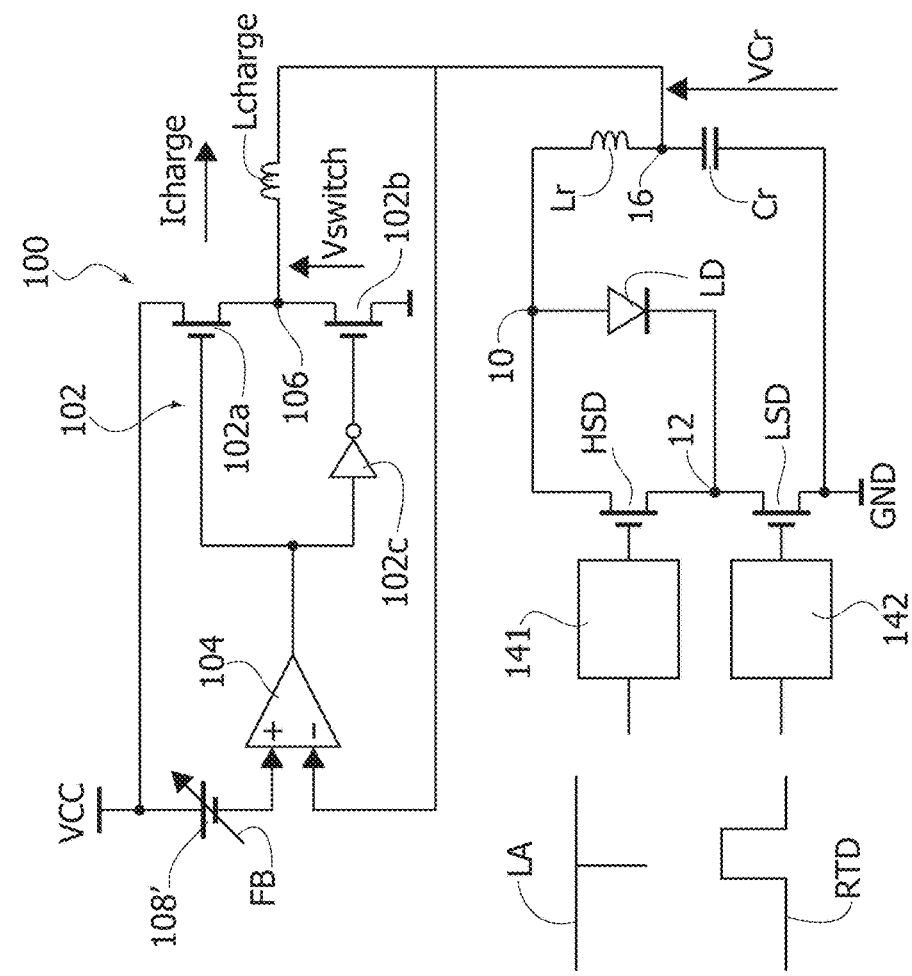
FIG. 5A is a circuit diagram exemplary of closed loop implementation of non-dissipative charging of a capacitor.

FIGS. 5A and 5B refer to non-dissipative charge control of Cr in a closed loop configuration.

The circuit of FIG. 5A is essentially like the circuit of FIG. 4A, with the exception of a variable threshold 108' being introduced in order to define the value of Cr charging voltage via the comparator 104.

The variable threshold 108' can be generated (in manner known per se) is such a way to be linked to (closed loop) feedback parameters, generally indicated as FB. These may include, for instance, V Cr itself or a parameter linked to V Cr, such as—by way of example—the current in the resonant tank and/or the power emitted by the laser diode.

A variable threshold such as 108' facilitates a continuous regulation of Vcr and/or defining calibration procedures.

The diagrams of FIG. 5B illustrate, against a common abscissa time scale, possible time behaviors of:
the voltage V Cr across Cr, plotted against the—variable—threshold 108' and a desired charge voltage Cr CV (upper diagram), and
the charge current Icharge plotted against the on-off cycle of Vswitch (lower diagram, with resonant tank activation again evidenced at RTA).

In an arrangement as illustrated in FIG. 5A, the close loop regulates the switch-off threshold so that the resonator voltage equals VCC at the activation of the firing.

In an arrangement as illustrated in FIG. 5A, the recharge inductor L Charge again operates in a continuous conduction mode.

Here again, the peak current in the recharge inductor may be 1.6 A with an average value of 1.3 A. As noted this is adequate for recharging the resonator Lr, Cr in applications as discussed in the foregoing.

Again, these are merely exemplary values, which are mentioned without any limiting intents of the embodiments.

FIGS. 6A and 6B refer to non-dissipative charge control of Cr with continuous current in a circuit configuration using only a charge inductor (namely, L Charge) coupled between VCC and Cr.

The inductor L Charge resonates with the capacitor Cr with oscillations generated by the activations of the resonant tank.

In a circuit as illustrated in FIG. 6A, the inductance value of the inductor L Charge value can be selected in order that resonance frequency of the LC resonator comprising L Charge and Cr is (much) lower than resonant tank activation frequency. In that way, the current in the inductor will again flow in a continuous mode.

Such a choice for the inductance value of the inductor L Charge may be otherwise advantageous also for the other implementations illustrated herein.

The diagrams of FIG. 6A illustrate, against a common abscissa time scale, possible time behaviors of:
- the voltage V Cr across Cr, plotted against the voltage VCC (upper diagram), and
- the charge current Icharge (lower diagram, with resonant tank activation again evidenced at RTA).

FIG. 6A shows that after a few cycles of resonant tank activations, the value of V Cr reaches a stable value at the instant of resonant tank activation.

In a configuration as illustrated in FIG. 6A, a value of VCC=6V may result in a resonator voltage equal to 11V at the activation of the firing.

Also in this case, the recharge inductor operates in continuous conduction mode with possible values for the peak current and the average current therein equal to 1.66 and 1.58, again adequate for recharging the resonator.

Once more, these figures are merely exemplary values, mentioned without any limiting intents of the embodiments.

FIGS. 7A and 7B refer to non-dissipative charge control of Cr with clamp and discontinuous inductor current.

By way direct comparison with FIG. 2, in a solution as illustrated in FIG. 7A, the charge inductor L Charge controlled by a charge switch CS (this can be, for instance, a H (half)bridge or the combination of an electronic switch plus a re-circulating diode D1).

As illustrated in FIG. 7A, a clamping diode D2 is connected between the capacitor Cr and a regulated voltage VCC.

The clamping diode D2 facilitates recovering the excess energy back to a reference voltage.

The diode D1 facilitates current (re)circulation in the inductor L Charge when the switch CS is off (nonconductive).

In a solution as illustrated in FIG. 7A, the value of the charge inductor L Charge can be determined in such a way that the resonance frequency identified by L Charge and Cr is about 4 times the frequency corresponding to the desired charging time of the capacitor (that is, the charge voltage reaches a desired peak value at ¼ of the resonant frequency).

This facilitates charging the capacitor Cr in a time which substantially ¼ the resonance period (the charging time should desirably be lower or equal to the frequency of activation of the resonant tank).

For instance the value of Vcr can reach Vcr0+2×(VCC−Vcr0) where Vcr0 is the value of Vcr when the charge switch CS is activated.

When using a regulated clamping voltage less than Vcr0+2×(VCC−Vcr0), the charging value of Vcr will reach a regulated value and will be clamped by this value.

The diagrams of FIG. 7B illustrate, against a common abscissa time scale, possible time behaviors of:
- the voltage V Cr across Cr, plotted against the clamping voltage CV (upper diagram), and
- the charge current Icharge plotted against the on-off cycle of Vswitch (lower diagram, with resonant tank activation again evidenced at RTA).

A solution as illustrated in FIG. 7A facilitates setting the value of VCr in one cycle.

Therefore this solution can be advantageously used in connection with arrangements where laser activations are not performed at a constant frequency.

Figure 8:
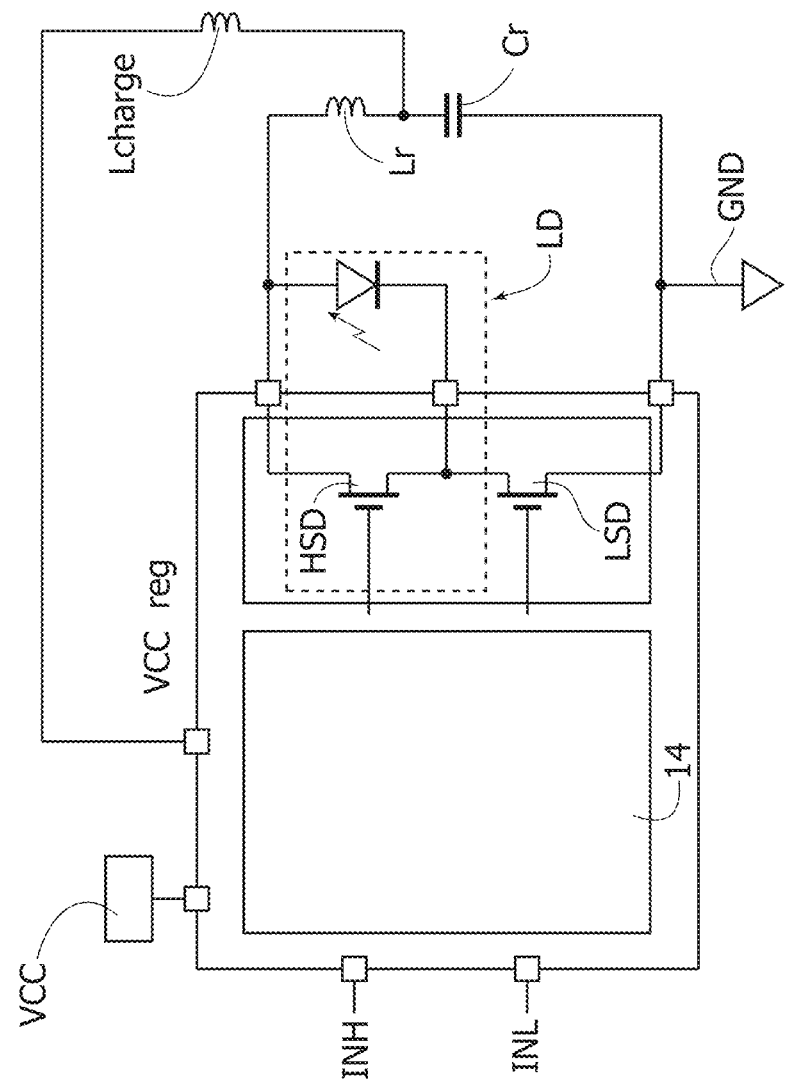
FIG. 8 is a representation of possible integration of a laser driver including a pulse generator circuit as per embodiments of the present description.

FIG. 8 is illustrative of the possible integration of circuit as discussed previously (the solution of FIG. 6 is represented for simplicity) in a LIDAR system for automotive use, for instance.

In FIG. 8, reference 14 designates as whole the high-side and low-side drive switches HSD and LSD, integrated together with the driver circuits previously referred to as 141, 142 plus associated controller circuitry configured to receive a (differential) input signal between input nodes INH and INL. Such an integrated assembly can be supplied with a supply voltage VCC.

Italian patent application No. 102019000029132/U.S. patent application Ser. No. 17/123,712 (already repeatedly cited) discloses an arrangement including a resonant tank such as Lr, Cr and two switches. When the two switches are on (conductive), the resonant tank exchange the energy stored in Cr with energy stored in Lr. When Vcr=0 the energy and the current in Lr reach the maximum value. When the HSD switch (in parallel to the load—here the diode LD) is turned off, the current flowing in Lr will flow in the load and the switching speed (di/dt) will be dependent on the inductance in the associated commutation loop.

This topology allows having very low inductance because the commutation loop including (only) the switch and the load can be very short and the associated stray inductances can be reduced below the 100 pH range.

FIG. 8 illustrates that a solution as disclosed herein further facilitates having a "short" commutation loop (enclosed in a dashed line) between the high-side drive switch HSD and the laser diode LD and a "longer" resonant loop Lr, Cr, with L Charge coupled between the resonant tank and a regulated voltage VCCreg.

An inductive charge circuitry as exemplified herein was found to reduce the power dissipation related to recharging the resonant tank capacitor Cr by a factor in excess of 10 in comparison with resistive solutions as exemplified in FIGS. 1 and 2, while retaining the possibility of achieving a value for the peak current $I_{Peak}$ which is a function of VCCreg* $(Cr/Lr)^{1/2}$ and an oscillation time constant Tr of the resonant tank given by $2\pi*(Lr*Cr)^{1/2}$.

In fact, a corresponding integrated circuit (IC) can include the control of the resonant tank with the laser activation together with the charge control. This facilitates controlling the amplitude of the current in the laser.

In conventional topologies measuring the current in the laser is hardly feasible due to difficulty of implementing reliable current sensing with 1 ns response time.

An IC as contemplated herein can i) measure the current in the resonant tank at frequencies in the range of 2 MHz (Tr=500 ns) and, based on this measurement, ii) generate a feedback signal to control V Cr that is linked to the maximum value for the current $I_{Lr}$ in the inductor Lr (the current is the load LD cannot exceed $I_{Lr}$).

Inductive charge circuitry as exemplified herein may facilitate control of L Charge and Cr resonance and a well-controlled charge voltage of Cr.

Relying on resonance, the controlled voltage can be rendered higher or lower than the supply voltage, with the circuit operating a buck boost converter.

Continuous current operation of L Charge may facilitate reducing the peak current in a charge switch so that such a charge switch can be easily integrated in an IC, which in turn facilitates integrating the Cr charge control circuitry in a laser driver IC.

For instance, circuitry as exemplified herein may facilitate a compact implementation of integrated Gallium nitride (GaN) transistors of a 4 channel laser driver and PCB layout.

A pulse generator circuit as exemplified herein may comprise:
- a first node (for instance, 10) and a second node (for instance, 12) configured to apply a pulse signal to an electrical load (for instance, LD) coupled therebetween;

a first electronic switch (for instance, HSD) coupled between the first node and the second node;
a second electronic switch (for instance, LSD) coupled between the second node and a reference node (for instance, GND);
an LC resonant circuit (for instance, Lr, Cr) comprising a series connection of an inductance (for instance, Lr) and a capacitance (for instance, Cr) having an intermediate node (for instance, 16) therebetween, the LC resonant circuit coupled between the first node and the reference node;
charge circuitry (for instance, 100) coupled between a supply node (for instance, VCC) and the intermediate node in the LC resonant circuit;
drive circuitry (for instance, 14, 141, 142) of the first electronic switch and the second electronic switch, the drive circuitry configured to repeat switching cycles in a sequence of switching cycles comprising charge time intervals wherein the first electronic switch is closed and the second electronic switch is open and the capacitance in the LC resonant circuit is charged via the charge circuitry,
wherein the charge circuitry comprises a further inductance (for instance, L Charge) in a current flow line between the supply node and the intermediate node in the LC resonant circuit.

In a pulse generator circuit as exemplified herein, the charge circuitry may consist (only) of a further inductance in a current flow line between the supply node and the intermediate node in the LC resonant circuit.

In a pulse generator circuit as exemplified herein,
the drive circuitry of the first electronic switch and the second electronic switch may be configured to activate the LC resonant circuit with an activation frequency,
the further inductance and the capacitance in the LC resonant circuit may resonate at a resonance lower than the activation frequency of the LC resonant circuit.

In a pulse generator circuit as exemplified herein, the charge circuitry may comprise:
a comparator (for instance, 104) configured to perform a comparison of the charge voltage (for instance, V Cr) of the capacitance in the LC resonant circuit with a charge threshold (for instance, 108, 108'), and
a charge switch (for instance, 102) arranged in the current flow line intermediate the supply node and the further inductance, the charge switch activatable to couple the further inductance to the supply node as a function of the outcome of the comparison at the comparator.

In a pulse generator circuit as exemplified herein, the charge threshold may comprise a variable threshold (for instance, 108').

In a pulse generator circuit as exemplified herein, the variable threshold may be variable as a function of the charge voltage of the capacitance in the LC resonant circuit or a parameter linked thereto.

In a pulse generator circuit as exemplified herein, the charge circuitry may comprise:
a charge switch (for instance, 102) arranged in the current flow line intermediate the supply node (for instance, VCCreg) and the further inductance, the charge switch controllably (for instance, 143) activatable to couple the further inductance to the supply node,
a clamping diode (for instance, D2) connected between the supply node and the intermediate node (for instance, 16) in the LC resonant circuit.

In a pulse generator circuit as exemplified herein the inductance (for instance, Lr) and the capacitance (for instance, Cr) in the LC resonant circuit may be coupled:
between the first node and the intermediate node, and
between the intermediate node and the reference node, respectively.

A pulsed operation system (that is, a system configured for pulsed operation) as exemplified herein may comprise:
a pulse generator circuit as exemplified herein, and
an electrical load (for instance, LD) coupled intermediate the first node and the second node.

In a pulsed operation system as exemplified herein, the electrical load may comprises one or more laser diodes (for instance, LD).

A method of operating a pulse generator circuit as exemplified herein or a pulsed operation system as exemplified herein may comprise actuating the first electronic switch and the second electronic switch cyclically repeating during a sequence of switching cycles:
charge time intervals, wherein the first electronic switch is closed and the second electronic switch is open and the capacitance in the LC resonant circuit is charged via the charge circuit,
pulse generation time intervals, wherein the first electronic switch is open and the second electronic switch is closed and the LC resonant circuit provides a pulsed current to the load via the first node and the second node,
oscillation time intervals interleaved with the charge and pulse generation time intervals, wherein in the oscillation time intervals the first electronic switch and the second electronic switch are both closed and the LC resonant circuit oscillates at a resonance frequency.

Without prejudice to the underlying principles, the details of construction and the embodiments may vary widely with respect to what has been described and illustrated herein purely by way of example, without thereby departing from the scope of the embodiments.

The extent of protection is determined by the annexed claims.

What is claimed is:

1. A pulse generator circuit comprising:
a first node and a second node configured to apply a pulse signal to an electrical load coupled therebetween;
a first electronic switch coupled between the first node and the second node;
a second electronic switch coupled between the second node and a reference node;
an LC resonant circuit comprising a series connection of an inductance and a capacitance having an intermediate node therebetween, the LC resonant circuit coupled between the first node and the reference node;
charge circuitry comprising a further inductance in a current flow line between a supply node and the intermediate node in the LC resonant circuit; and
drive circuitry of the first electronic switch and the second electronic switch, the drive circuitry configured to repeat switching cycles of a sequence of switching cycles comprising:
charge time intervals, wherein the first electronic switch is closed and the second electronic switch is open and the capacitance in the LC resonant circuit is charged via the charge circuit;
wherein the charge circuitry comprises:
a comparator configured to perform a comparison of a charge voltage of the capacitance in the LC resonant circuit with a charge threshold; and a charge switch arranged in the current flow line intermediate the supply node and the further inductance, the charge switch activatable to couple the further inductance to the supply node as a function of an outcome of the comparison at the comparator.

2. The pulse generator circuit of claim 1, wherein the charge circuitry consists of the further inductance in the current flow line between the supply node and the intermediate node in the LC resonant circuit.

3. The pulse generator circuit of claim 1, wherein the sequence of switching cycles further comprises:
   pulse generation time intervals, wherein a pulsed current is provided to the electrical load via the first and second nodes; and
   oscillation time intervals interleaved with the charge and pulse generation time intervals, wherein the LC resonant circuit oscillates at a resonance frequency.

4. The pulse generator circuit of claim 3, wherein the drive circuitry is configured to, during the oscillation time intervals, activate the LC resonant circuit with an activation frequency that is higher than the resonance frequency.

5. The pulse generator circuit of claim 1, wherein the charge threshold comprises a variable threshold.

6. The pulse generator circuit of claim 5, wherein the variable threshold is variable as a function of the charge voltage of the capacitance in the LC resonant circuit or a parameter linked thereto.

7. The pulse generator circuit of claim 1, wherein the charge circuitry comprises:
   a charge switch arranged in the current flow line intermediate the supply node and the further inductance, the charge switch controllably activatable to couple the further inductance to the supply node; and
   a clamping diode connected between the supply node and the intermediate node in the LC resonant circuit.

8. The pulse generator circuit of claim 1, wherein:
   the inductance in the LC resonance circuit is coupled between the first node and the intermediate node; and
   the capacitance in the LC resonance circuit is coupled between the intermediate node and the reference node.

9. A pulsed operation system, comprising:
   a pulse generator circuit comprising:
      a first node and a second node configured to provide a pulse signal;
      a first electronic switch coupled between the first node and the second node;
      a second electronic switch coupled between the second node and a reference node;
      an LC resonant circuit comprising a series connection of an inductance and a capacitance having an intermediate node therebetween, the LC resonant circuit coupled between the first node and the reference node;
      charge circuitry comprising a further inductance in a current flow line between a supply node and the intermediate node in the LC resonant circuit; and
      drive circuitry of the first electronic switch and the second electronic switch, the drive circuitry configured to repeat switching cycles of a sequence of switching cycles comprising:
         charge time intervals, wherein the first electronic switch is closed and the second electronic switch is open and the capacitance in the LC resonant circuit is charged via the charge circuit; and
      an electrical load coupled intermediate the first node and the second node;
   wherein the charge circuitry comprises:
      a comparator configured to perform a comparison of a charge voltage of the capacitance in the LC resonant circuit with a charge threshold; and
      a charge switch arranged in the current flow line intermediate the supply node and the further inductance, the charge switch activatable to couple the further inductance to the supply node as a function of an outcome of the comparison at the comparator.

10. The pulsed operation system of claim 9, wherein the electrical load comprises at least one laser diode.

11. The pulsed operation system of claim 9, wherein the charge circuitry consists of the further inductance in the current flow line between the supply node and the intermediate node in the LC resonant circuit.

12. The pulsed operation system of claim 9, wherein the sequence of switching cycles further comprises:
   pulse generation time intervals, wherein a pulsed current is provided to the electrical load via the first and second nodes; and
   oscillation time intervals interleaved with the charge and pulse generation time intervals, wherein the LC resonant circuit oscillates at a resonance frequency.

13. The pulsed operation system of claim 12, wherein the drive circuitry is configured to activate the LC resonant circuit with an activation frequency that is higher than the resonance frequency of the LC resonant circuit.

14. The pulsed operation system of claim 9, wherein the charge threshold comprises a variable threshold.

15. The pulsed operation system of claim 14, wherein the variable threshold is variable as a function of the charge voltage of the capacitance in the LC resonant circuit or a parameter linked thereto.

16. The pulsed operation system of claim 9, wherein the charge circuitry comprises:
   a charge switch arranged in the current flow line intermediate the supply node and the further inductance, the charge switch controllably activatable to couple the further inductance to the supply node; and
   a clamping diode connected between the supply node and the intermediate node in the LC resonant circuit.

17. The pulsed operation system of claim 9, wherein:
   the inductance in the LC resonance circuit is coupled between the first node and the intermediate node; and
   the capacitance in the LC resonance circuit is coupled between the intermediate node and the reference node.

18. A method of operating a pulse generator circuit, the pulse generator circuit comprising first and second nodes, a first electronic switch coupled between the first node and the second node, a second electronic switch coupled between the second node and a reference node, an LC resonant circuit comprising a series connection of an inductance and a capacitance having an intermediate node therebetween, the LC resonant circuit coupled between the first node and the reference node, and charge circuitry comprising a further inductance in a current flow line between a supply node and the intermediate node in the LC resonant circuit, the method comprising cyclically repeating during a sequence of switching cycles:
   closing the first electronic switch and opening the second electronic switch during charge time intervals, thereby charging the capacitance in the LC resonant circuit via the charge circuit;
   opening the first electronic switch and closing the second electronic switch during pulse generation time intervals, thereby providing, by the LC resonant circuit, a pulsed current to an electrical load via the first node and the second node;

closing the first and second electronic switches during oscillation time intervals that are interleaved with the charge and pulse generation time intervals, thereby oscillating the LC resonant circuit at a resonance frequency;

comparing a charge voltage of the capacitance in the LC resonant circuit with a charge threshold; and activating a charge switch, arranged in the current flow line intermediate the supply node and the further inductance, to couple the further inductance to the supply node as a function of an outcome of the comparing.

19. The method of claim 18, further comprising, during the oscillation time intervals, activating the LC resonant circuit with an activation frequency that is higher than the resonance frequency.

* * * * *